(12) United States Patent
Oshimo et al.

(10) Patent No.: US 8,921,237 B2
(45) Date of Patent: Dec. 30, 2014

(54) METHOD OF DEPOSITING A FILM

(71) Applicant: Tokyo Electron Limited, Tokyo (JP)

(72) Inventors: Kentaro Oshimo, Iwate (JP); Masato Koakutsu, Iwate (JP); Hiroko Sasaki, Iwate (JP); Hiroaki Ikegawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/134,065

(22) Filed: Dec. 19, 2013

(65) Prior Publication Data

US 2014/0179104 A1    Jun. 26, 2014

(30) Foreign Application Priority Data

Dec. 26, 2012  (JP) ................................. 2012-283175

(51) Int. Cl.
| | |
|---|---|
| *H01L 21/31* | (2006.01) |
| *H01L 21/02* | (2006.01) |
| *H01L 21/285* | (2006.01) |
| *H01L 21/687* | (2006.01) |

(52) U.S. Cl.
CPC ...... *H01L 21/0228* (2013.01); *H01L 21/28556* (2013.01); *H01L 21/68764* (2013.01); *H01L 21/68771* (2013.01)
USPC ............ 438/782; 438/503; 438/505; 438/680

(58) Field of Classification Search
USPC .......... 438/503, 505, 507, 509, 680, 758, 782
See application file for complete search history.

(56) References Cited

U.S. PATENT DOCUMENTS

| | | | | |
|---|---|---|---|---|
| 6,391,800 | B1 * | 5/2002 | Redd et al. .................... | 438/782 |
| 6,613,700 | B2 * | 9/2003 | Hall et al. ..................... | 438/782 |
| 7,018,679 | B2 * | 3/2006 | Nolte et al. ................. | 427/421.1 |
| 8,496,991 | B2 * | 7/2013 | Yoshihara et al. ............ | 427/240 |

FOREIGN PATENT DOCUMENTS

| | | |
|---|---|---|
| JP | 4583764 | 11/2010 |
| JP | 4661990 | 3/2011 |

* cited by examiner

*Primary Examiner* — Kevin M Picardat
(74) *Attorney, Agent, or Firm* — IPUSA, PLLC

(57) ABSTRACT

A method of depositing a film using an atomic layer deposition (ALD) method while rotating a turntable provided inside a chamber and including a substrate mounting portion, onto which a substrate can be mounted, to cause the substrate to pass through first and second process areas, into which different gases to be mutually reacted are respectively supplied, including coating the turntable with the film under a state where the wafer is not mounted onto the turntable, the turntable is rotated, and the substrate mounting portion has a predetermined temperature; and processing to deposit the film on the wafer under a state where the wafer is mounted onto the turntable, the turntable is rotated, and the substrate has a temperature equal to or less than the predetermined temperature.

9 Claims, 12 Drawing Sheets

METHOD OF DEPOSITING A FILM

CROSS-REFERENCE TO RELATED APPLICATIONS

This patent application is based upon and claims the benefit of priority of Japanese Patent Application No. 2012-283175 filed on Dec. 26, 2012, the entire contents of which are incorporated herein by reference.

BACKGROUND OF THE INVENTION

1. Field of the Invention

The present invention relates to a method of depositing a film.

2. Description of the Related Art

A manufacturing process of a semiconductor integrated circuit (IC) includes a process of forming a thin film on a semiconductor wafer. In this process, improvement in evenness of a surface of a wafer is required in view of further microminiaturization of an IC. As a method of depositing a film to satisfy this requirement, a method of depositing the film called an atomic layer deposition (ALD) method or a molecular layer deposition (MLD) method is considered. According to the ALD method, a cycle in which one (a reaction gas A) of two types of reaction gases, which mutually react, is caused to adsorb on the surface of the wafer, and the adsorbing reaction gas A is reacted with the other one (a reaction gas B) of the two types of reaction gases is repeated thereby depositing a thin film made of a reaction product onto the surface of the wafer. Because the ALD method uses the adsorption of the reaction gas onto the surface of the wafer, the ALD method has an advantage that film thickness evenness and film thickness controllability are excellent.

A turntable-type film deposition apparatus is disclosed in Japanese Patent No. 4661990 as a film deposition apparatus performing the ALD method. This film deposition apparatus includes a turntable, which is rotatable and is positioned in a vacuum chamber, and on which a plurality of wafers are mounted, a separating area that is laid out above the turntable and separates a gas supplying area for the reaction gas A from a gas supplying area for the reaction gas B, evacuation ports corresponding to the gas supplying areas where the reaction gas A and the reaction gas B are supplied, and an evacuation device connected to these evacuation ports. In this film deposition apparatus, the wafers pass through the gas supplying area for the reaction gas A, the separating area, the gas supplying area for the reaction gas B, and the separating area along rotation of the turntable. With this, the reaction gas A adsorbs onto the surface of the wafer in the gas supplying area for the reaction gas A, and the reaction gas A reacts with the reaction gas B in the gas supplying area for the reaction gas B. Therefore, it is not necessary to change the reaction gas A to the reaction gas B while depositing the film, and the reaction gases A and B can be continuously supplied. Therefore, there is an advantage that an evacuation/purge process is unnecessary thereby shorting a time period for depositing the film.

Meanwhile, along with higher integration of the semiconductor memory, a capacitor using a high-dielectric material such as a metal oxide as a high-dielectric material is more frequently used. The electrodes of this capacitor are made from titanium nitride (TiN) having relatively great work function.

The TiN electrodes are produced by depositing TiN onto a high dielectric layer by a chemical vapor deposition (CVD) method using titanium chloride ($TiCl_4$) and ammonia ($NH_3$) as raw gases and patterning the deposited TiN as disclosed, for example, Japanese Patent No. 4583764.

For example, when raw gases of titanium chloride and ammonia are used in a manner similar to the raw gases used in the CVD method, the above film deposition apparatus of the turntable type is used to deposit a film by the ALD method, and it may be possible to deposit a film of titanium nitride by a process having excellent film thickness evenness and film thickness controllability and a shortened time period for depositing the film.

In this film deposition using the ALD method, there is a requirement of depositing the film under a condition where a temperature is higher than that in a conventional technique. In the above film deposition of TiN, there is a requirement that the film is formed under the condition where a temperature is higher than that in the conventional technique.

SUMMARY OF THE INVENTION

Accordingly, embodiments of the present invention may provide a novel and useful method of depositing a film.

According to an aspect of the present invention, there is provided a method of depositing a film using an atomic layer deposition (ALD) method while rotating a turntable provided inside a chamber and including a substrate mounting portion, onto which a substrate can be mounted, to cause the substrate to pass through first and second process areas, into which different gases to be mutually reacted are respectively supplied, including coating the turntable with the film under a state where the wafer is not mounted onto the turntable, the turntable is rotated, and the substrate mounting portion has a predetermined temperature; and processing to deposit the film on the wafer under a state where the wafer is mounted onto the turntable, the turntable is rotated, and the substrate has a temperature equal to or less than the predetermined temperature.

DETAILED DESCRIPTION OF EMBODIMENTS

When the film is deposited by the above film deposition apparatus of the turntable type under a condition where the temperature is higher than that in the conventional technique, metallic impurities contained in the chamber and the turntable, a metallic component contained in a part made of stainless steel or the like, and the raw gas may react. Then, there may be a case where metallic contamination in the film occurs by the metal containing copper or the like.

A description is given below, with reference to the figures of the embodiments of the present invention.

In the embodiments described below, the reference symbols typically designate as follows:
1: chamber;
2: turntable;
4: convex portion;
11: ceiling plate;
12: chamber body;
15: transfer opening;
24: circular concave portion (wafer mounting portion);
31, 32: reaction gas nozzle;
41, 42: separation gas nozzle;
D: separating area;
P1: first process area;
P2: second process area;
H: separation space;
W: wafer.

In the above-mentioned figures, the same or corresponding reference symbols are attached to the same or corresponding members and parts, and description of overlapping explanation is omitted. Further, in the figures, relative ratios among the members and the parts are not intended to be illustrated. Therefore, dimensions are to be practically determined by a person ordinarily skilled in art in light of the following non-limiting embodiment.

(Film Deposition Apparatus)

Figure 1:
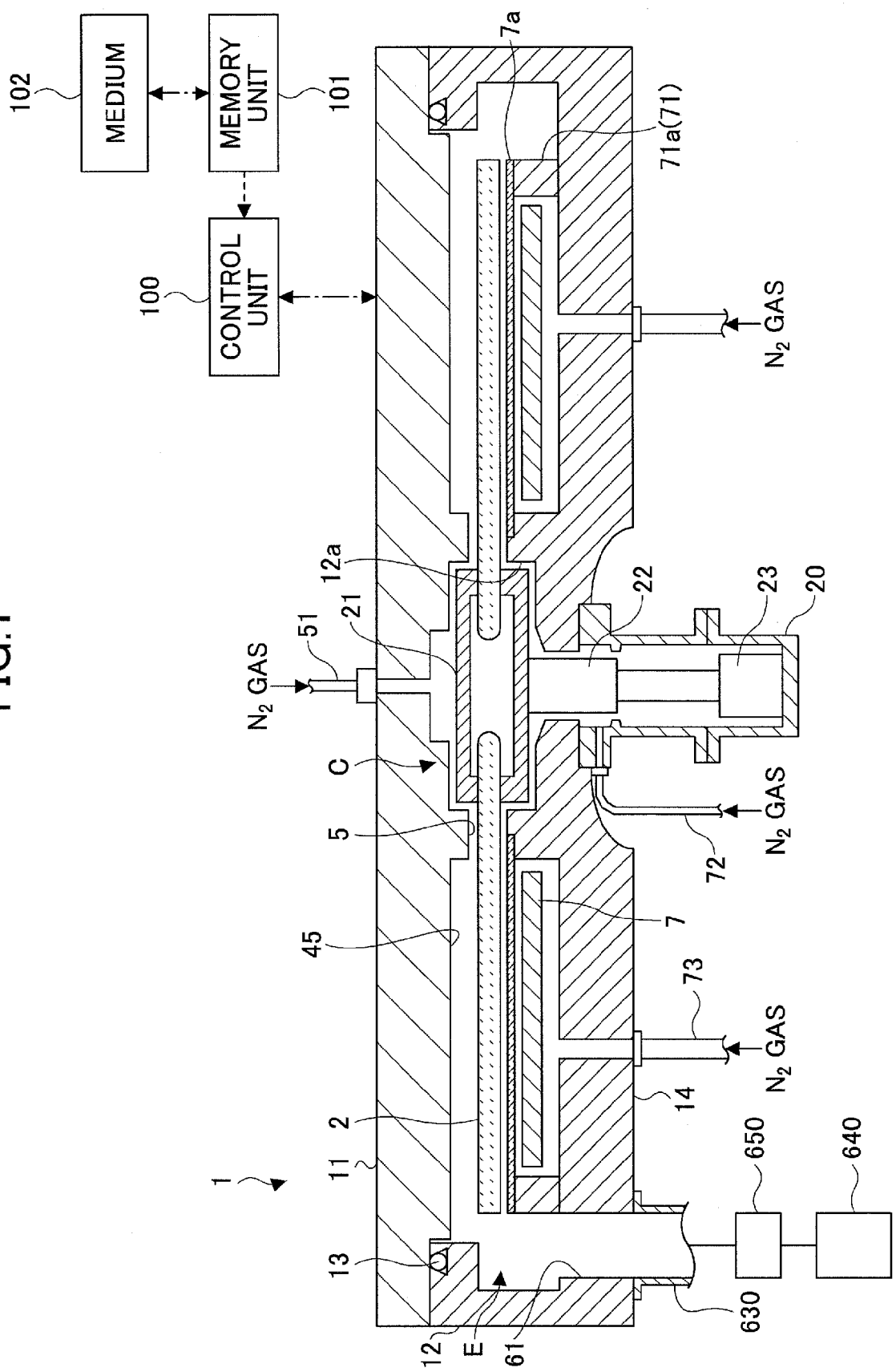
FIG. 1 is a cross-sectional view for illustrating a film deposition apparatus preferable for performing a method of depositing a film of an embodiment of the present invention.
Figure 2:
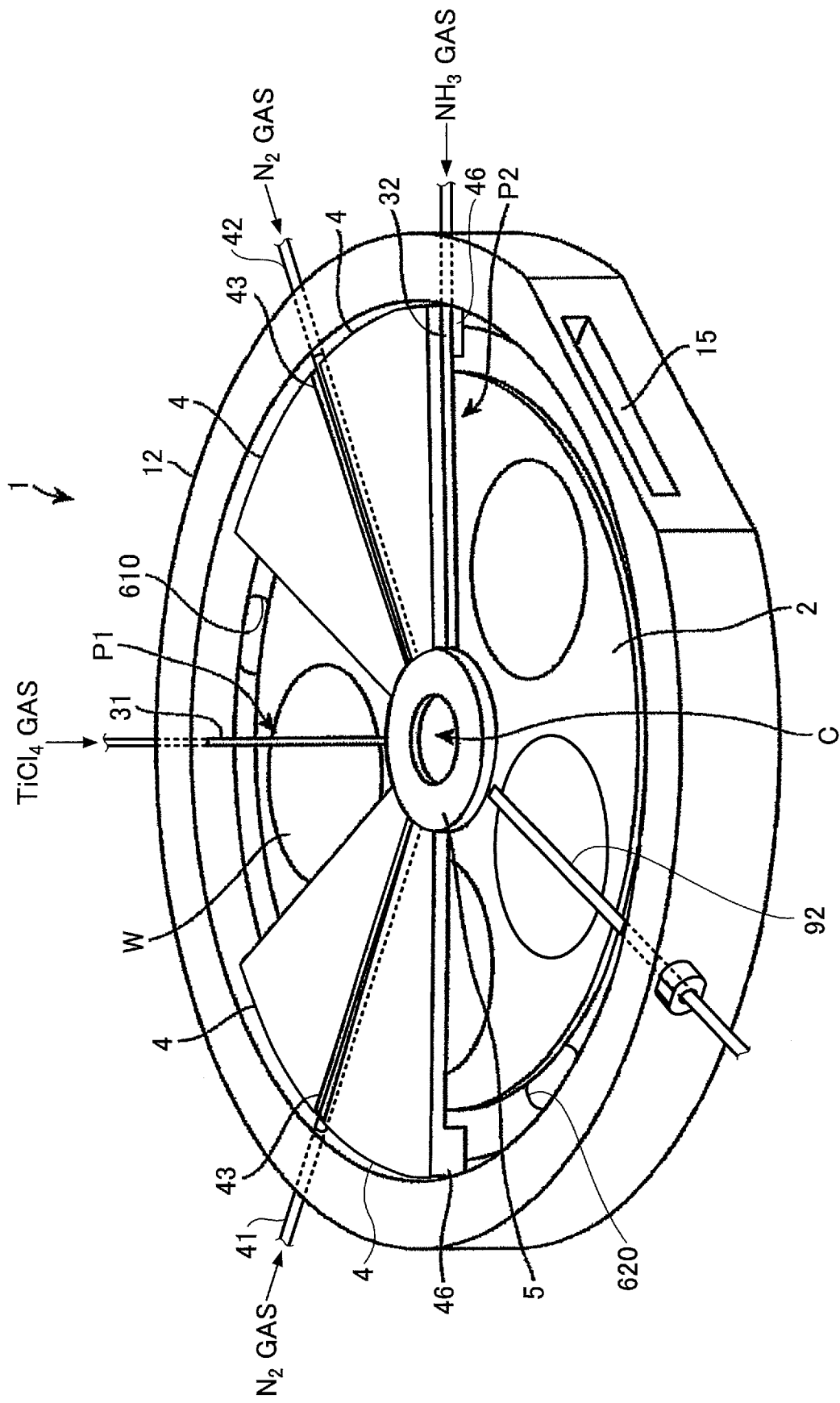
FIG. 2 is a perspective view for illustrating a film deposition apparatus preferable for performing the method of depositing the film of the embodiment of the present invention.
Figure 3:
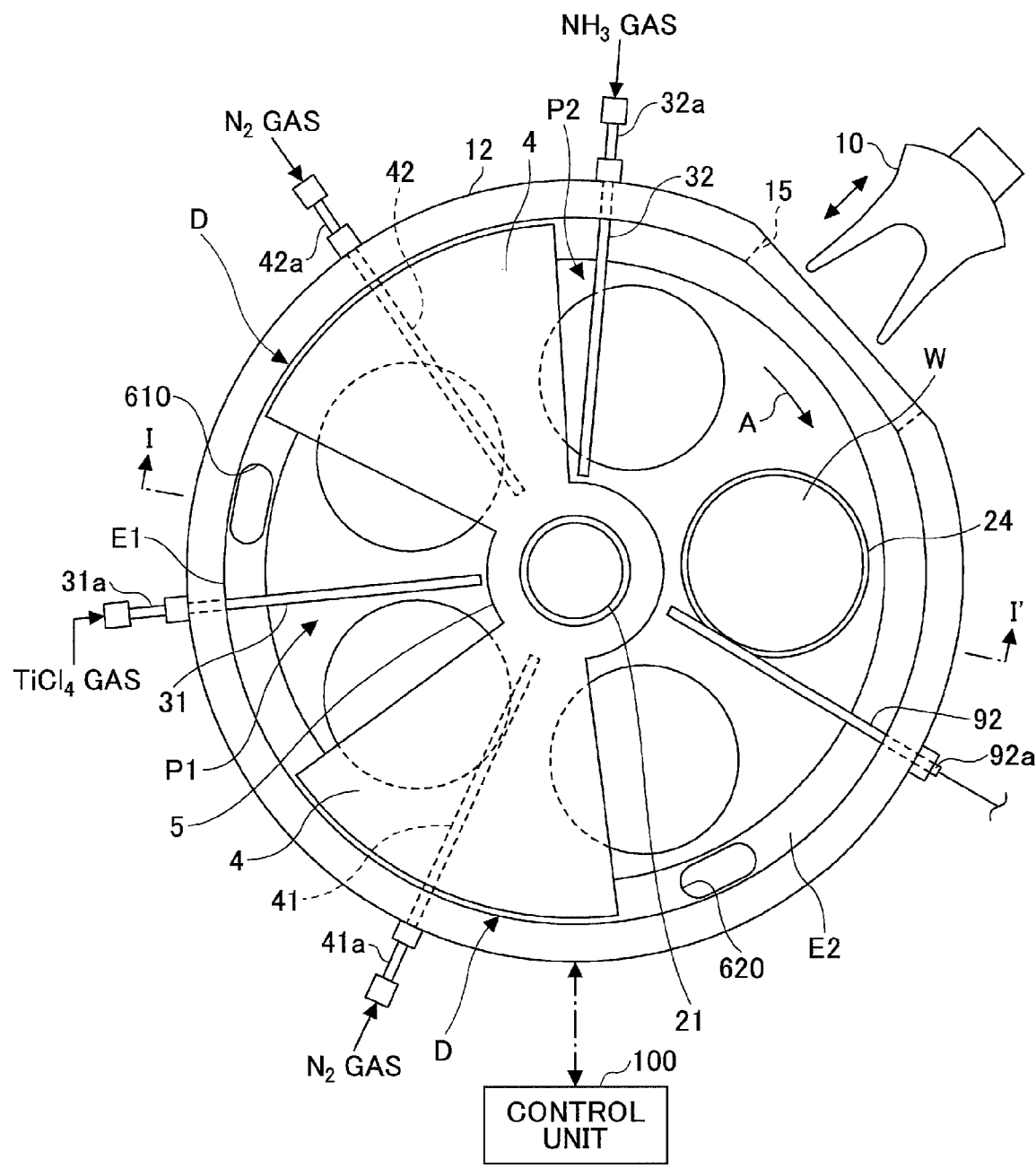
FIG. 3 is a plan view for illustrating the film deposition apparatus preferable for performing the method of depositing the film of the embodiment of the present invention.

FIG. 1 is a cross-sectional view of an exemplary film deposition apparatus preferable for performing a method of depositing a film of an embodiment of the present invention. FIG. 2 is a perspective view of the exemplary film deposition apparatus suitable for performing the method of depositing the film of the embodiment. FIG. 3 is a plan view for illustrating the film deposition apparatus preferable for performing the method of depositing the film of the embodiment of the present invention.

At first, a film deposition apparatus preferable for performing the method of depositing the film of the embodiment is described. Referring to FIGS. 1 to 3, the film deposition apparatus of the embodiment includes a chamber 1 having a substantially circular shape in its plan view and a flattened shape in its side view, and a turntable 2 having its rotational center in the center of the chamber 1. The chamber 1 includes a chamber body 12 having a bottomed cylindrical shape, and a ceiling plate 11, which is detachably provided onto the upper surface of the chamber body 12 through a sealing member 13 (see FIG. 1) such as an O-ring to hermetically seal the chamber 1.

The chamber 1 may be made of various material, for example, aluminum (Al). When the chamber 1 is assembled, a screw made of stainless steel is used to assemble the chamber 1. The screw may contain various metals such as copper (Cu). When the inside of the chamber 1 is heated in a film deposition process, copper may separate out as an impurity from the screw. Within the method of depositing the film of the embodiment, production of metallic contaminant is effectively prevented. A specific content of the method of depositing the film will be described in detail later.

The turntable 2 is fixed by a core portion 21 in a cylindrical shape at the center portion of the turntable 2. The core unit 21 is fixed to the upper end of a rotational shaft 22 extending in the vertical direction. The rotational shaft 22 penetrates through a bottom portion 14 of the chamber 1. The lower end of the rotational shaft 22 is attached to a driving mechanism 23, which causes the rotational shaft 22 (see FIG. 1) to rotate around the vertical axis of the rotational shaft 22. The rotational shaft 22 and the driving mechanism 23 are accommodated in a cylindrical case body 20 whose upper surface is opened. A flange on the upper surface of the case body 20 is hermetically attached to the lower surface of a bottom portion 14 of the chamber 1 to maintain a gastight state between the inner atmosphere and the outer atmosphere of the case body 20.

Referring to FIG. 2 and FIG. 3, circular concave portions 24 for receiving a plurality of semiconductor wafers (5 wafers are illustrated in FIGS. 2 and 3) are provided on a surface of the turntable 2 along a rotational direction (a peripheral direction) of the turntable 2. FIG. 3 illustrates a state where the wafer W is mounted in only one circular concave portion 24 for convenience. The inner diameter of the circular concave portion 24 is slightly greater than the diameter of the wafer W by, for example, 4 mm. The depth of the circular concave portion 24 is substantially equal to the thickness of the wafer W. Therefore, when the wafer W is accommodated in the circular concave portion 24, the height of the surface of the wafer W is substantially the same as the height of the surface of the turntable in an area where the wafer is not mounted. Through holes (not illustrated), through which lift pins for lifting up and down the back surfaces of the wafers W by supporting the back surfaces, penetrate through the bottom surfaces of the circular concave portions 24. For example, the number of the lift pins is three.

The turntable 2 may be made of various material, and may be made of, for example, quartz. There may be a case where quartz may contain stainless steel as an impurity, and such stainless steel may contain a metallic impurity such as copper. Although such metallic impurity may be produced as metallic contaminant when the turntable 2 is heated at a high temperature, such metallic impurity prevents metallic contaminant from being produced by the method of depositing the film of the embodiment. A specific content of the method of depositing the film will be described in detail later.

FIGS. 2 and 3 illustrate the structure inside the chamber 1. For convenience, the ceiling plate 11 is omitted from illustration in FIGS. 2 and 3. As illustrated in FIGS. 2 and 3, a reaction gas nozzle 31, a reaction gas nozzle 32, and separation gas nozzles 41, 42, which are made of, for example, quartz, are arranged above the turntable 2 while interposing gaps in a peripheral direction of the chamber 1 (a rotational direction along an arrow A in FIG. 3 of the turntable 2). In FIG S. 2 and 3, the separation gas nozzle 41, the reaction gas nozzle 31, the separation gas nozzle 42, and the reaction gas nozzle 32 are arranged in this order in a clockwise direction (the rotational direction of the turntable 2) from a transfer opening 15 described below. These nozzles 31, 32, 41, and 42 are attached to the chamber body 12 by fixing gas introducing ports 31a, 32a, 41a, and 42a (see FIG. 3), which are base portions of the nozzles 31, 41, and 42, respectively, to the outer peripheral wall of the chamber 1 so as to horizontally extend along radii of the chamber body 12. Thus, these nozzles 31, 32, 41, and 42 are introduced inside the chamber 1 from the outer peripheral wall of the chamber 12.

Within the embodiment, the reaction gas nozzle 31 is connected to a supplying source (not illustrated) of a titanium chloride ($TiCl_4$) gas through a pipe arrangement, a flow controller, or the like (not illustrated). The reaction gas nozzle 32 is connected to a supplying source (not illustrated) of ammonia through a pipe arrangement, a flow controller, or the like (not illustrated). The separation gas nozzles 41 and 42 are connected to a supplying source (not illustrated) of a separation gas through a pipe arrangement, a flow controller, or the like (not illustrated). The separation gas may be an inert gas such as a rare gas of helium (He), Argon (Ar) or the like or a nitrogen ($N_2$) gas. Within the embodiment, the $N_2$ gas is used.

A plurality of gas ejection holes 33 opening toward the turntable 2 are arranged in the reaction gas nozzles 31 and 32 along the longitudinal directions of the reaction gas nozzles 31 and 32 at an interval of, for example, 10 mm. In an area below the reaction gas nozzle 31, there is a first process area P1 used to cause a $TiClH_4$ gas to adsorb onto the wafer W. The lower area of the reaction gas nozzle 32 is a second process area P2 where the $TiClH_4$ gas adsorbing onto the wafer W in the first process area P1 is nitrided.

Referring to FIGS. 2 and 3, two convex portions 4 are provided inside the chamber 1. The convex portions 4 are attached to the back surface of the ceiling plate 11 so as to protrude toward the turntable 2. Thus, the convex portions 4 and the separation gas nozzles 41, 42 form the separating areas D. The convex portions 4 are described in detail later. Each convex portion 4 has a substantially sector form in its plan view with its apex cut in a circular arc shape. Within this embodiment, an inner circular arc is connected to a ring-shaped protruding portion (described later), and an outer circular arc is arranged along an inner peripheral surface of the chamber body 12 of the chamber 1.

Figure 4:
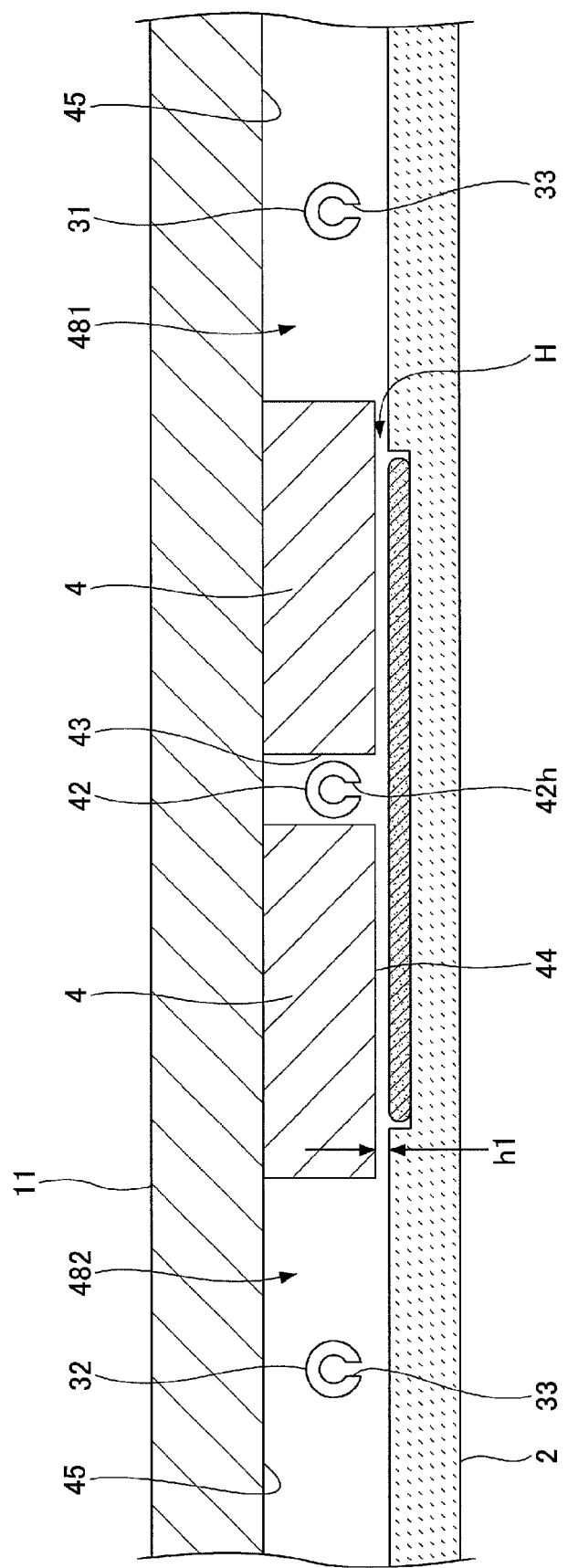
FIG. 4 is a cross-sectional view of a chamber along a concentric circle of an exemplary turntable of the film deposition apparatus preferable for performing the method of depositing the film of the embodiment of the present invention.

FIG. 4 is a cross-sectional view of the chamber 1 along a concentric circle of the turntable 2 from the reaction gas nozzle 31 to the reaction gas nozzle 32. As illustrated, a convex portion 4 is attached onto the back surface of the ceiling plate 11. There are a low ceiling surface 44 (a first ceiling surface), which is a lower surface of the convex portion 4, and a high ceiling surface 45 (a second ceiling surface), which is a higher surface of the convex portion 4 and is positioned on both sides of the low ceiling surface 44 in a peripheral direction. The low ceiling surface 44 is shaped like a sector having an outer edge cut so as to form like a circular arc in its plan view. Further, as illustrated in FIG. 4, a groove portion 43 is formed in a center of the convex portion 4 in its peripheral direction so as to extend in a radius direction. The separation gas nozzle 42 is accommodated inside the groove portion 43. Another groove portion 43 is similarly formed in another convex portion 4. The separation gas nozzle 41 is accommodated in the other groove portion 43. The reaction gas nozzles 31 and 32 are provided in spaces lower than the high ceiling surface 45. The reaction gas nozzles 31 and 32 are provided in the vicinity of the wafer W and apart from the ceiling surface 45. For convenience of explanation, the lower space of the ceiling surface 45 where the reaction gas nozzle 31 is provided is called a space 481, and the lower space of the ceiling surface 45 where the reaction gas nozzle 32 is provided is called a space 482.

A plurality of gas injection holes 42h (see FIG. 4) opening toward the turntable 2 are provided in the separation gas nozzle 42, which is accommodated in the groove portion 43 of the convex portion 4. The gas injection holes 42h are arranged along the longitudinal direction of the separation gas nozzle 42 at an interval of, for example, 10 mm. Although it is not illustrated, this point is similar to the separation gas nozzle 41.

A separation space H, which is narrow, is formed between the low ceiling surface 44 and the turntable 2. When the $N_2$ gas is supplied from the gas ejection holes 42h of the separation gas nozzle 42, the $N_2$ gas flows toward the spaces 481 and 482 through the separation space H. At this time, the volume of the separation space H is smaller than the volumes of the spaces 481 and 482. Therefore, the pressure of the separation space H can be set relatively higher than the pressures in the spaces 481 and 482 by the $N_2$ gas. Said differently, the separation space H having a high pressure is formed between the spaces 481 and 482. Further, the $N_2$ gas flown from the separation space H to the spaces 481 and 482 functions as counter flows against the $TiCl_4$ gas from the first flow area P1 and the $NH_3$ gas from the second process area P2. Thus, the $TiCl_4$ gas from the first flow area P1 and the $NH_3$ gas from the second process area P2 are separated by the separation space H. Therefore, it is possible to prevent the $TiCl_4$ gas from the first flow area P1 and the $NH_3$ gas from the second process area P2 from mixing inside the chamber 1.

It is preferable to set the height h1 of the ceiling surface 44 relative to the upper surface of the turntable 2 suitable for increasing the pressure in the separation space H to be higher than the pressures in the spaces 481 and 482 in consideration of the pressure inside the chamber 1 at the time of depositing the film, the rotational speed of the turntable 2, the supply amount of the separation gas (the $N_2$ gas), or the like.

As illustrated in FIGS. 2 and 3, a ring-shaped protruding portion 5 surrounding the outer periphery of the core portion 21, to which the turntable 2 is fixed, is provided under the lower surface of the ceiling plate 11. The ring-shaped protruding portion 5 is continuously formed from the convex portions 4 at portions on a side of the rotation center of the convex portions 4. The lower surface of the ring-shaped protruding portion 5 has substantially the same height as that of the ceiling surface 44.

FIG. 1 is a cross-sectional view taken along a line I-I' of FIG. 3. FIG. 1 illustrates an area where the ceiling surface 45 is provided.

Figure 5:
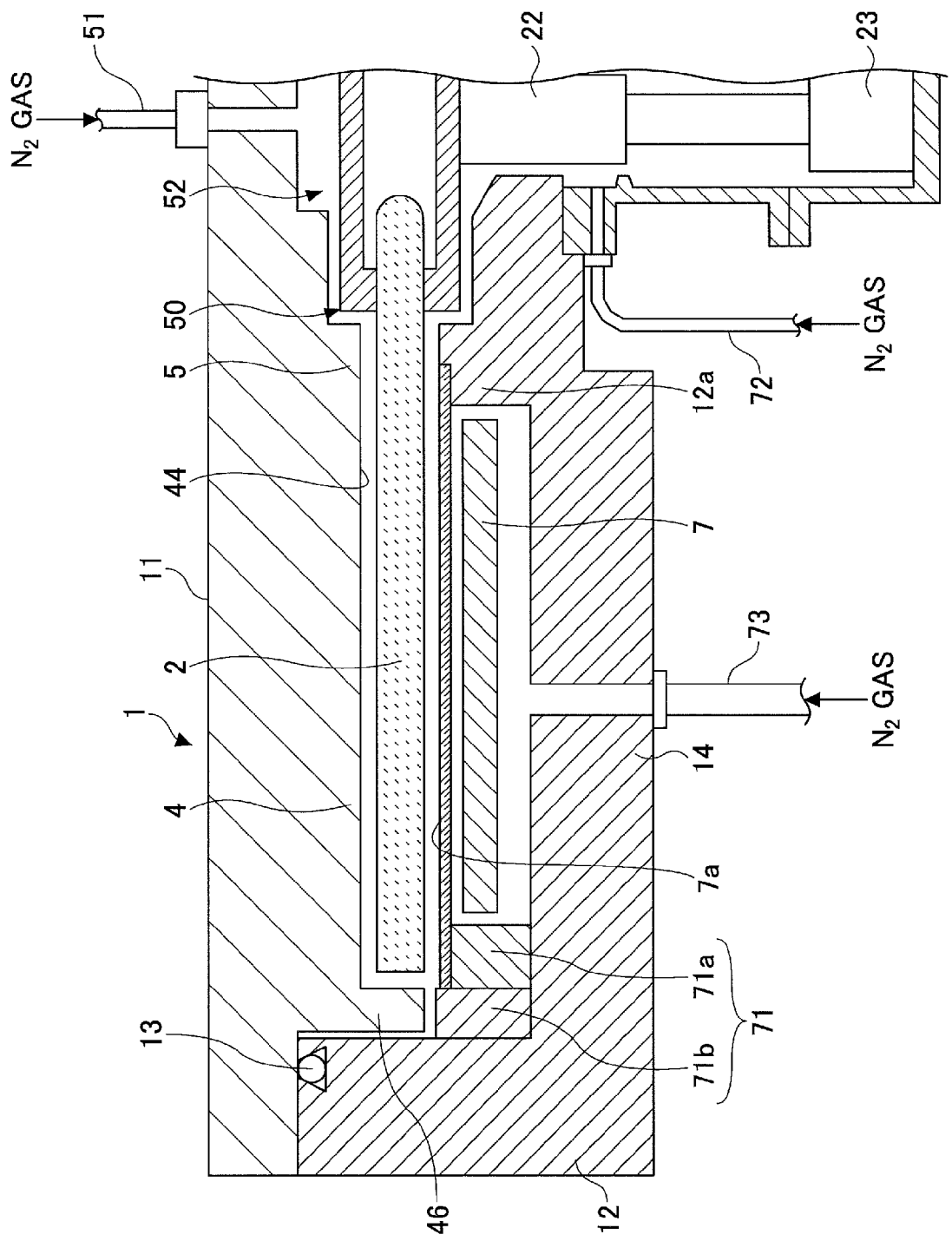
FIG. 5 is a cross-sectional view for illustrating the film deposition apparatus preferable for performing the method of depositing the film of the embodiment of the present invention.

FIG. 5 is a cross-sectional view of an area including the ceiling surface 44 of the film deposition apparatus 1. As illustrated in FIG. 5, a peripheral edge portion (a portion of the chamber 1 on the outer edge side) of the convex portion 4 in a substantially sector form has a bent portion 46 bent in a L-like shape so as to face the outer end surface of the turntable 2. The bent portion 46 prevents reaction gases from intruding from the both sides of the separating area D in a manner similar to the convex portion 4 to prevent the reaction gases from mixing. The convex portion 4 in the substantially sector form is provided in the ceiling plate 11. Because the ceiling plate 11 is detachable from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 are set to have a dimension similar to, for example, that of a gap between the ceiling surface 44 and the upper surface of the turntable 2.

As illustrated in FIG. 4, the inner peripheral wall of the chamber body 12 is formed to be a perpendicular surface approaching the outer peripheral surface of the bent portion 46. However, a portion of the inner peripheral wall of the chamber body 12 other than the separating area D is recessed toward the outer side between a part opposite to the outer end surface of the turntable 2 toward the bottom portion as illustrated in FIG. 1. Hereinafter, for convenience of explanation, this recessed portion having a substantially rectangular shape in its cross-sectional view is referred to as an evacuation area E. Specifically, as illustrated in FIG. 3, the evacuation area communicating with the first process area P1 is referred to as a first evacuation area E1 and the evacuation area communicating with the second process area P2 is referred to as a second evacuation area E2. A first evacuation port 610 and a second evacuation port 620 are respectively formed in the bottom portions of the first and second evacuation areas E1 and E2, as illustrated in FIGS. 1 to 3. Referring to FIG. 1, the first and second evacuation ports 610 and 620 are connected to, for example, a vacuum pump 640 being an evacuating means through exhaust pipes 630. Referring to FIG. 1, a reference symbol 650 designates a pressure controller.

As illustrated in FIGS. 1 and 4, a heater unit 7 being a heating means is provided in a space between the turntable 2 and the bottom portion 14 of the chamber 1. The wafer W on the turntable 2 is heated through the turntable 2 to have a temperature determined in a process recipe (for example, 610° C.). The heater unit 7 heats the wafer W mounted on the circular concave portion 24 so as to have a predetermined temperature during the film deposition process while the wafer W is mounted on the circular concave portion 24.

Within the method of depositing the film of the embodiment, during so-called coating while the film deposition process is performed under a state where the wafer W is not mounted on the circular concave portion 24, the turntable 2 is heated so that eh wafer W has a predetermined temperature when the wafer W is mounted on the circular concave portion 24. This coating is performed to stabilize the film deposition process before the film deposition process is performed. In this coating, the raw gas is supplied under the state where the wafer W is mounted on the circular concave portion 24 and simultaneously an operation similar to the film deposition process is performed while rotating the turntable 2. At this time, a preset temperature may be based on, for example, the temperature of the circular concave portion 24 of the turntable 2. Because the circular concave portion 24 is a wafer mounting area, by controlling the temperature of the circular concave portion 24, the temperature is controlled under a substantially the same standard both in cases where the wafer W is mounted and not mounted. Within the method of depositing the film of the embodiment, the coating is performed while the circular concave portion 24 is set to be the predetermined temperature. Subsequently, the circular concave portion 24 or the wafer W is set to be equal to or less than the predetermined temperature. Thus, the process of two stages is applied to reduce metal contamination (metallic contamination), which is described in detail later.

Referring to FIG. 5, on the lower side of the turntable 2, a cover member 71 like a ring is provided to prevent the gas from intruding into a lower area lower than the turntable 2 by separating an atmosphere between an upper space upper than the turntable 2 and the evacuation areas E1 and E2 from an atmosphere where the heater unit 7 is installed. The cover member 71 includes an inner member 71*a* provided in a position vertically corresponding to the outer edge portion of the turntable 2 and to an outer peripheral side outer than the outer edge portion of the turntable 2, and an outer member 71*b* provided between the inner member 71*a* and the inner wall surface of the chamber 1. The outer member 71*b* is provided in the vicinity of the bent portion 46 formed on the outer edge portion of the convex portion 4 in the separating areas D under the bent portions 46. The inner member 71*a* surrounds the entire periphery of the heater unit 7 and is positioned under the outer edge portion and a portion slightly outer than the outer edge portion.

A part of the bottom portion 14 closer to the rotation center than the space where the heater unit 7 is arranged has the ring-shaped protruding portion 12*a* protruding upward toward the lower surface of the core portion 21 provided on the lower surface of the turntable 2 and in the vicinity of the center portion of the turntable 2. A narrow space is provided between the ring-shaped protruding portion 12*a* and the core portion 21. A gap between the inner peripheral surface of a through hole for the rotational shaft 22 penetrating through the bottom portion 14 and the rotational shaft 22 is small. The narrow space and the small gap communicate with the inside of the casing 20. A purge gas supplying pipe 72 is provided in the case body 20 so that the $N_2$ gas being the purge gas is supplied into the narrow space to purge the narrow space. In the bottom portion 14 of the chamber 1, a plurality of purge gas supplying pipes 73 are provided to purge a space where the heater unit 7 is arranged under the heater unit 7 at intervals of a predetermined angle in the peripheral direction (only one purge gas supplying pipe 73 is illustrated in FIG. 5). Further, a lid member 7*a* is provided between the heater unit 7 and the turntable 2. The lid member 7*a* restricts the gas from intruding into an area where the heater unit 7 is installed to bridge the inner peripheral wall of the outer member 71*b* (the upper surface of the inner member 71*a*) and the upper end portion of the ring-shaped protruding portion 12*a* along the peripheral direction so as to cover the heater unit 7 and so on. The lid member 7*a* is made of, for example, quartz.

A separation gas supplying tube 51 is connected to a center portion of the ceiling plate 11 of the chamber 1. The separation gas being the $N_2$ gas is supplied to a space 52 between the ceiling plate 11 and the core portion 21. The separation gas supplied to the space 52 is discharged toward the periphery of the turntable 2 along the surface on the side of a wafer mounting area of the turntable 2 through a narrow gap 50 between the ring-shaped protruding portion 5 and the turntable 2. The space 50 is maintained to have a pressure higher than those of the spaces 481 and 482 by the separation gas. Therefore, it is possible to prevent the $TiCl_4$ gas supplied to the first process area P1 and the $NH_3$ gas supplied to the second process area P2 from mixing after passing through the center area C. Said differently, the space 50 (or the center area C) functions in a manner similar to the separation space H (or the separating area D).

As illustrated in FIGS. 2 and 3, a transfer opening 15 is formed in the side wall of the chamber 1 for serving and receiving the wafer W being the substrate between a transfer arm 10 provided outside the chamber 1 and the turntable 2. The transfer opening 15 is opened and closed by a gate valve (not illustrated). The wafer W is served and received between the circular concave portion 24, which is the wafer mounting area of the turntable 2, and the transfer arm 10 at a position of the turntable 2 facing the transfer opening 15. Further, a lift pin (not illustrated) for lifting the wafer W from the back surface side to serve and receive the wafer W and a lifting mechanism (not illustrated) for lifting the lift pin (not illustrated) are provided at a portion of the turntable 2 corresponding to the position where the wafer W is served and received. The lift pin penetrates through the circular concave portion 24 of the turntable 2.

Further, as illustrated in FIG. 1, a control unit 100 includes a computer for controlling operations of the film deposition apparatus of the embodiment in its entirety. A program to be executed by the film deposition apparatus under control of the control unit 100 is stored in a memory of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 by a predetermined reading device and is installed inside the control unit 100.

(Method of Depositing Film)

Figure 6:
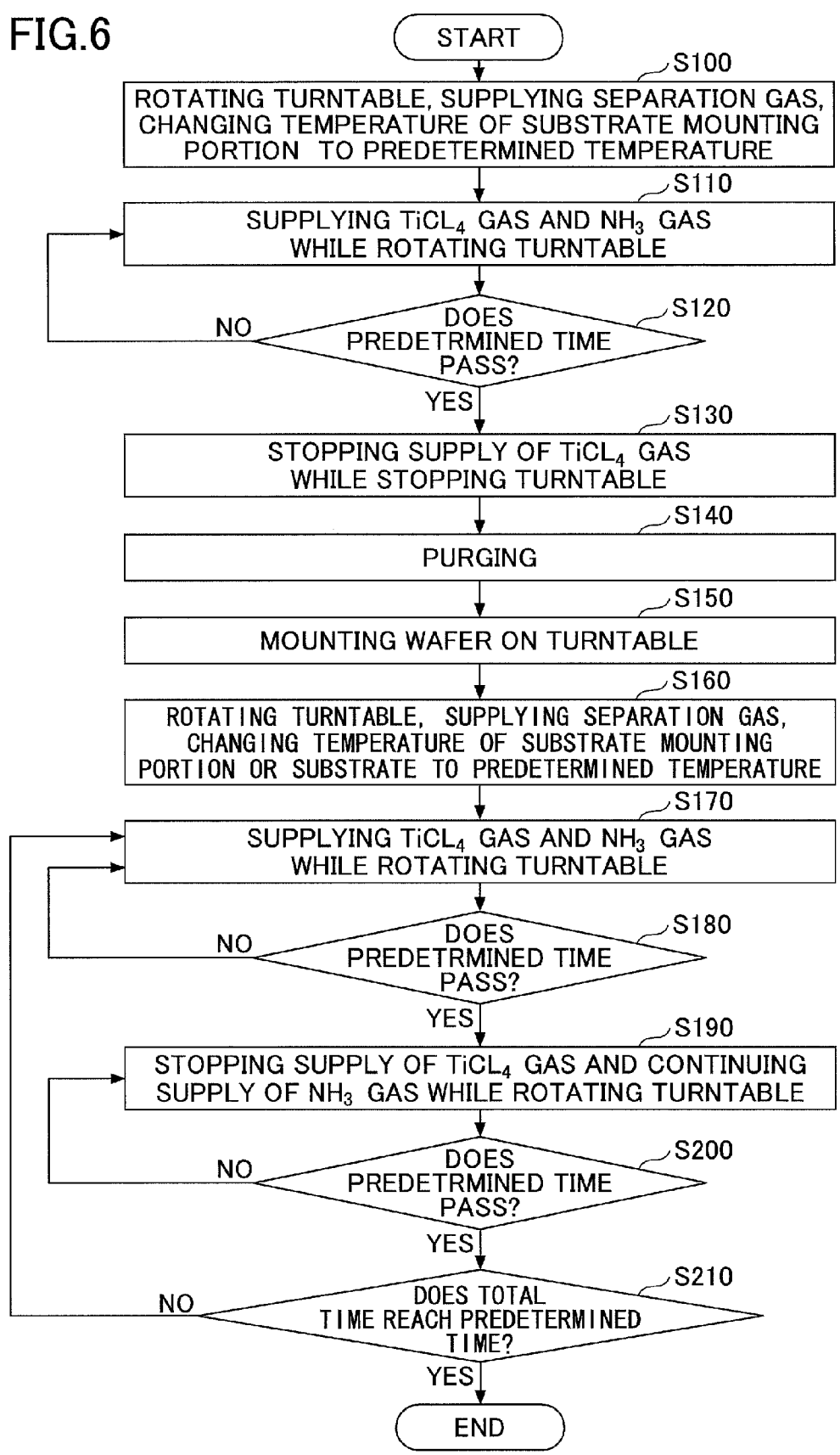
FIG. 6 is a flow chart of the method of depositing the film of the embodiment of the present invention.

Referring to FIG. 6, the method of depositing the film of the embodiment of the present invention is described. Hereinafter, an example that the above film deposition apparatus is used is described.

FIG. 6 is a flow chart of the method of depositing the film of the embodiment of the present invention. At first, a gate valve (not illustrated) is closed so that the chamber 1 is hermetically closed. This hermetically closed state of the chamber 1 is a starting state. The method of depositing the film of the embodiment includes a coating step of forming a film on the surface of the turntable 2 without mounting the wafer W on the circular concave portion 24 of the turntable 2 and a processing step of forming a film onto the surface of the wafer W after mounting the wafer W onto the circular concave portion 24 of the turntable 2. At first, the coating step is performed and the processing step is performed next. Hereinafter, the contents of the method of depositing the film is described in detail. The coating step of steps S100 to S140 is described.

In step S100, after evacuating the inside of the chamber 1 to an attainable degree of vacuum by the vacuum pump 640. Thereafter, the $N_2$ gas is supplied at a predetermined flow rate from the separation gas nozzles 41 and 42, and the $N_2$ gas is supplied at a predetermined flow rate from the separation gas supplying pipe 51 and the purge gas supplying pipes 72, 72. At this time, a pressure control means 650 (see FIG. 1) controls the inside of the chamber 1 to have a predetermined process pressure. Subsequently, the turntable 2, more specifically the vicinity of the circular concave portion 24 is heated at, for example, 610° C., while the turntable 2 is rotated at a rotational speed of, for example, 240 rpm in the clockwise direction.

In the processing step, the heating temperature generated by the heater unit 7 is set to be equal to or less than a predetermined temperature set in the coating step. In the processing step, the temperature is frequently determined depending on the process. Therefore, in the coating step, the heating temperature is determined so as to be equal to or more than the preset temperature in the processing step. Within the embodiment, an example that the heating temperature is 610° C. is described. However, the processing step is frequently performed at various temperatures in a range of 300° C. to 610° C. Therefore, the heating temperature in the coating step may be determined at an appropriate temperature in the range of 350° C. to 610° C.

In the processing step of forming TiN, if the temperature of the wafer W is equal to or more than 600° C., it is experimentally confirmed that a thin film having a low resistance can be formed (deposited). Therefore, within the embodiment, an example that the temperature of the wafer W is set to 610° C. being more than 600° C. is described in consideration of the process of forming the TiN film having the low resistance. Meanwhile, even if the temperature of the wafer W is changed from 610° C. to 600° C., such a TiN film having a low resistance can be deposited.

The reason why the heating temperature is set higher than that in the processing step in the coating step is to increase the particle size of the TiN film to be formed on the turntable 2 by heating at a high temperature and narrow a diffusion route of metallic impurities. Said differently, in a case where a metallic contaminant is produced from the turntable 2, the chamber 1, or the like, if this contaminant diffuses inside the deposited TiN film, the TiN film is contaminated by the metal. However, if the particle size of the TiN film is great, the diffusion route of the metallic contaminant is supposed to be blocked to prevent the metallic contaminant from diffusing inside the TiN film. The detailed description of this is given later.

In step S110, the $TiCl_4$ gas is supplied from the reaction gas nozzle 31 (see FIGS. 2 and 3), and the $NH_3$ gas is supplied from the reaction gas nozzle 32. By the rotation of the turntable 2, the wafer W passes through the first process area P1, the separating area D (a separation space H), the second process area P2, and the separating area D (a separation space H) in this order. In the first process area P1, the $TiCl_4$ gas from the reaction gas nozzle 31 adsorbs onto the turntable 2. Next, a predetermined portion of the turntable 2, onto which the $TiCl_4$ gas adsorbs, passes through the separation space H (the separating area D) having a $N_2$ gas atmosphere and reaches the second process area P2. Then, the $TiCl_4$ gas adsorbing onto the turntable 2 reacts the $NH_3$ gas from the reaction gas nozzle 32 to deposit the TiN film on the turntable 2. Further, $NH_4Cl$ is produced as a by-product and is emitted into a gas atmosphere so as to be ejected together with the separation gas and so on. The predetermined portion of the turntable 2, onto which TiN is deposited, reaches the separating area D (the separation space H of the $N_2$ gas atmosphere).

In step S120, it is determined whether supply of the $TiCl_4$ gas from the reaction gas nozzle 31 and supply of the $NH_3$ gas from the reaction gas nozzle 32 continue for a predetermined time. The predetermined time may be appropriately set depending on the usage. For example, the predetermined time may be set depending on a film thickness causing a film performance of the deposited TiN film to be stable. Because the TiN film is impermeant, if the film thickness is not sufficient, a permeant part and an impermeant film coexist in the film. In this case, the film performance is not stabilized. Therefore, it is preferable to set the predetermined time for the supply of the $TiCl_4$ gas and the supply of the $NH_3$ gas so that the TiN film is sufficiently deposited for making all parts of the TiN film impermeant. Such a film thickness for causing the film performance to be stabilized is, specifically, 500 nm. Therefore, for example, the supply time of the reaction gas may be set so that the film thickness of TiN becomes 700 nm, or the supply time may be set to be, for example, 7000 seconds.

In step S120, in a case where the predetermined time does not pass, the process returns to step S110 to continue the film deposition of TIN. After the predetermined time passes, the process goes to the next step S130.

In step S130, the supply of the $TiCl_4$ gas from the reaction gas nozzle 31 is stopped. The $NH_3$ gas is supplied from the reaction gas nozzle 32 while rotating the turntable 2. With this, the wafer W is sequentially exposed to the $N_2$ gas (the separation gas) and the $NH_3$ gas.

In step S140, the N2 gas is continuously supplied from the separation gas nozzles 41 and 42 to purge the inside of the chamber 1. Then, the supply of the gas from the reaction gas nozzles 31 and 32 may be stopped, or the inert gas such as a $N_2$ gas or an Ar gas may be supplied. Therefore, the atmosphere inside the chamber 1 becomes an atmosphere of the inert gas.

Steps S100 through S140 are the coating step. In the coating step, the heating temperature is set so that the circular concave portion 24 of the turntable 2 has a predetermined temperature equal to or more than the heating temperature in the processing step.

Next, the processing step of steps S150 to S210 is described.

At first, in step S150, the wafer W is mounted on the turntable 2. Specifically, a gate valve (not illustrated) is opened. The wafer W is served into the circular concave portion 24 of the turntable 2 through the transfer opening 15 (see FIGS. 2 and 3) by the transfer arm 10 (see FIG. 3) provided outside the chamber 1. When the circular concave portion 24 is stopped at a position facing the transfer port 15, the lift pin (not illustrated) lifts up or down from the bottom portion side of the chamber 1 through the through hole in the bottom surface of the circular concave portion 24 to serve or receive the wafer W. The wafer W is served and received while the turntable 2 is intermittently rotated to thereby mount the wafers W inside the five circular concave portions 24.

In step S160, the gate valve is closed and the inside of the chamber 1 is evacuated to have an attainable degree of vacuum, to which the vacuum pump 640 can evacuate. Thereafter, the $N_2$ gas is discharged from the separation gas nozzles 41 and 42 at predetermined flow rates, and the $N_2$ gas is discharged from the separation gas supplying pipe 51 and the purge gas supplying pipes 72, 72 at predetermined flow rates. At this time, the pressure control means 650 (see FIG. 1) controls the inside of the chamber 1 to have a preset process pressure. Subsequently, the wafers W and the circular concave portions 24 are heated at, for example, 610° C., while the turntable 2 is rotated at a rotational speed of, for example, 120 rpm or 240 rpm in the clockwise direction.

Because the temperature of the wafers W and the temperature of the circular concave portions 24 on which the wafers W are mounted are substantially the same. Therefore, any one of the temperatures of the wafers W and the circular concave portions 24 may be used as the standard. Further, the heating temperature generated by the heater unit 7 in the processing step is sufficient to be equal to or less than the heating temperature in the coating step. In a case where the heating temperature in the coating step is 610° C., it is possible to set the heating temperature in the coating step to be an arbitrary temperature equal to or less than 610° C. depending on the usage in the process. Generally, because the film deposition process is frequently performed at 300° C. or in a range between 350° C. and 610° C., the film deposition process may be set in a range between 300° C. and 610° C. For example, the temperature of the wafers W or the temperature of the circular concave portions 24 in the processing step may be set to be 600° C., which is slightly lower than 610° C., or 550° C., which is set as the temperature of the wafers W or the temperature of the circular concave portions 24 in the coating step.

For example, even if the wafers W are set to have a high temperature like 550° C., 600° C., or 610° C. in this film deposition process, the metallic contamination scarcely occurs. The reason why the metallic contamination scarcely occurs is supposed to be the prevention of the diffusion of the metallic contaminant by the large particle size of the film deposited on the inner surface of the chamber 1 and the film deposited on the turntable 2 as described above.

In step S170, the $TiCl_4$ gas is supplied from the reaction gas nozzle 31 (see FIGS. 2 and 3), and the $NH_3$ gas is supplied from the reaction gas nozzle 32. By the rotation of the turntable 2, the wafer W passes through the first process area P1, the separating area D (the separation space H), the second process area P2, and the separating area D (a separation space H) in this order (see FIG. 3). At first, in the first process area P1, the $TiCl_4$ gas from the reaction gas nozzle 31 adsorbs onto the wafers W. Next, after the wafer W passes through the separation space H (the separating area D) under the $N_2$ gas atmosphere and reaches the second process area P2, the $TiCl_4$ gas adsorbing onto the wafer W reacts with the $NH_3$ gas supplied from the reaction gas nozzle 32. Thus, the TiN film is deposited on the wafer W. Further, $NH_4Cl$ is produced as a by-product and is emitted onto a gas atmosphere so as to be ejected together with the separation gas and so on. Thus, the wafer W reaches the separating area D (the separation space H under the $N_2$ gas atmosphere).

In step S180, it is determined whether supply of the $TiCl_4$ gas from the reaction gas nozzle 31 and supply of the $NH_3$ gas from the reaction gas nozzle 32 continue for a predetermined time. This predetermined time may be determined based in an experiment described below and a result of the experiment.

In step S180, in a case where the predetermined time does not pass, the process returns to step S170 to continue the film deposition of TiN. After the predetermined time passes, the process goes to the next step S190.

In step S190, the supply of the $TiCl_4$ gas from the reaction gas nozzle 32 is stopped. The $NH_3$ gas is continuously supplied from the reaction gas nozzle 31 while rotating the turntable 2. With this, the wafers W are sequentially exposed to the $N_2$ gas (the separation gas) and the $NH_3$ gas. There is a probability that chloride (Cl) caused from unreacted $TiCl_4$ or decomposition of $TiCl_4$, may remain in the deposited TiN film. TiN is produced by the reaction of the unreacted $TiCl_4$ with the $NH_3$ gas, OR the remaining Cl is changed to $NH_4Cl$ by the $NH_3$ gas and desorbs from the film. Therefore, the impurity inside the deposited TiN film is reduced to improve the film quality of the TiN film. Thus, the resistance can be reduced.

In step S200, it is determined whether the supply of the $NH_3$ gas from the reaction gas nozzle 32 continues for the predetermined time. Here, the predetermined time may be appropriately set in consideration of the film thickness of the TiN film to be deposited in the processing step. The predetermined time may be 150 seconds to 600 seconds to make the film thickness to be 5 to 40 nm, or 300 seconds to 600 seconds to make the film thickness to be 10 to 40 nm.

In step S200, in a case where the predetermined time does not pass, the process returns to step S190. After the predetermined time passes, the process goes to next step S210.

In step S210, it is determined whether the total time of the time for step S180 and the time for step S150 reaches a predetermined time. In a case where the total time does not reach the predetermined time, the process returns to step S170 and TiN is further deposited. In a case where the total time reaches the predetermined time, the supply of the $TiCl_4$ gas and the supply of the $NH_3$ gas are stopped. Thus, the film deposition ends.

Here, steps S190 to S210 may be provided depending on the purpose of depositing the film when necessary. Said differently, in a case where the film quality is required to be improved even if the process time is prolonged, steps S190 to S201 are performed. In a case where it is important to improve the throughput while shortening the process time, steps S190 to S210 can be omitted.

As described, it is possible to reduce occurrence of the metallic contamination by performing the method of depositing the film of the embodiment illustrated in FIG. 6. Next, a mechanism of inhibiting the metallic contamination in the method of depositing the film of the embodiment is described.

Figure 7:
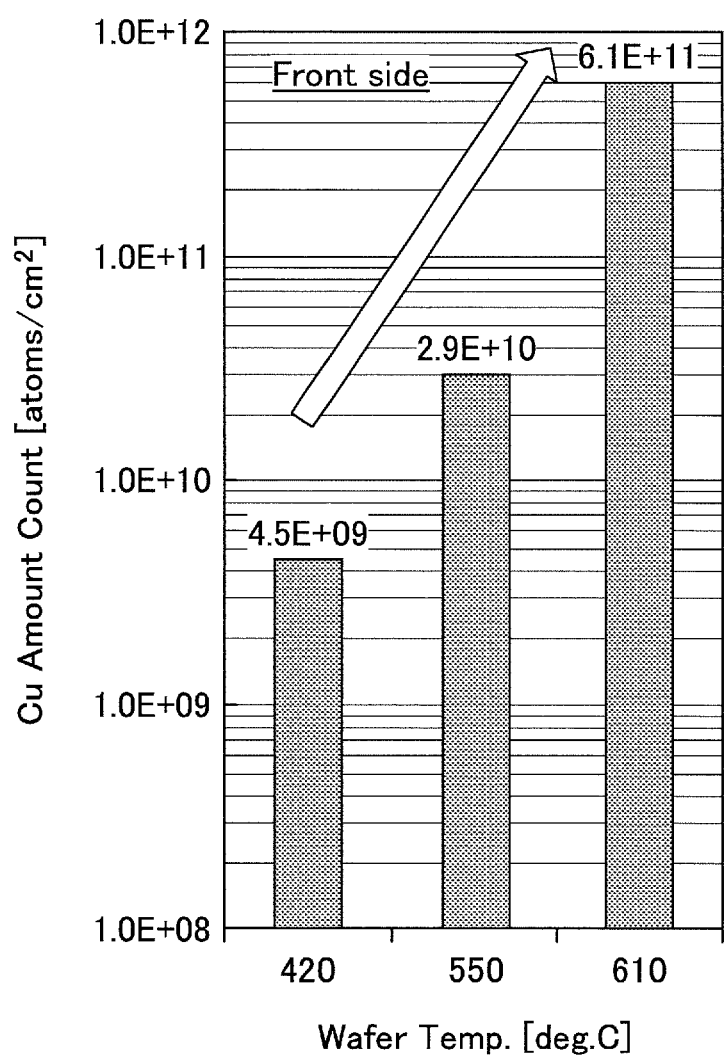
FIG. 7 illustrates a result of performing a method of depositing a film of a comparative example using the film deposition apparatus of the embodiment of the present invention.

FIG. 7 illustrates a result of performing a method of depositing a film of a comparative example using the film deposition apparatus of the embodiment of the present invention. Referring to FIG. 7, the amount of contamination by copper on the upper (surface) side of the TiN film when the temperature of the circular concave portion 24 is set to be 420° C. is illustrated for each temperature in the film deposition process. The abscissa axis represents the temperature (° C.) of the wafer during the film deposition process, and the ordinate axis represents the amount (atoms/cm$^2$) of contamination by copper of the wafer during the film deposition process.

Referring to FIG. 7, in a case where the temperature of the wafer W is 420° C., the amount of contamination by copper is small. In a case where the temperature of the wafer W is 550° C., the amount of contamination by copper increases. In a case where the temperature of the wafer W is 610° C., the amount of contamination by copper further increases to be equal to or more than 100 times of that in the case where the temperature of the wafer W is 420° C.

As described, in a case where the temperature at the time of coating is equal to the temperature at the time of performing the film deposition, it is possible to make the amount of contamination by copper relatively low. However, if the temperature at the time of coating is higher than the temperature at the time of the film deposition process, the contamination by the copper.

Figure 8:
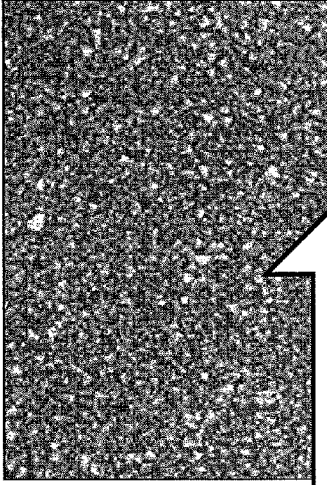
FIG. 8 illustrates a change of characteristics of the TiN film in high-temperature film deposition.

FIG. 8 illustrates a change of characteristics of the TiN film in high-temperature film deposition. Referring to FIG. 8, there are illustrated SEM (Scanning Electron Microscope) photos of the surface of a TiN film having a film thickness of 40 nm and the surface of a TiN film having a film thickness of 40 nm for each preset temperature of the wafer W. In comparison with the surfaces of the TiN films having the film thickness of 100 nm at temperature of 420° C. and 550° C., the sizes of particle sizes of the TiN film are clearly greater in the TIN film at the temperature of 550° C. In comparison with the surfaces of the TiN films having the film thickness of 40 nm at temperature of 550° C. and 610° C., the sizes of particle sizes of the TiN film are greater in the TiN film at the temperature of 610° C.

As described, when the film thicknesses are the same, the particle sizes of the TiN film become greater in the film deposition process under the higher temperature.

Figure 9:
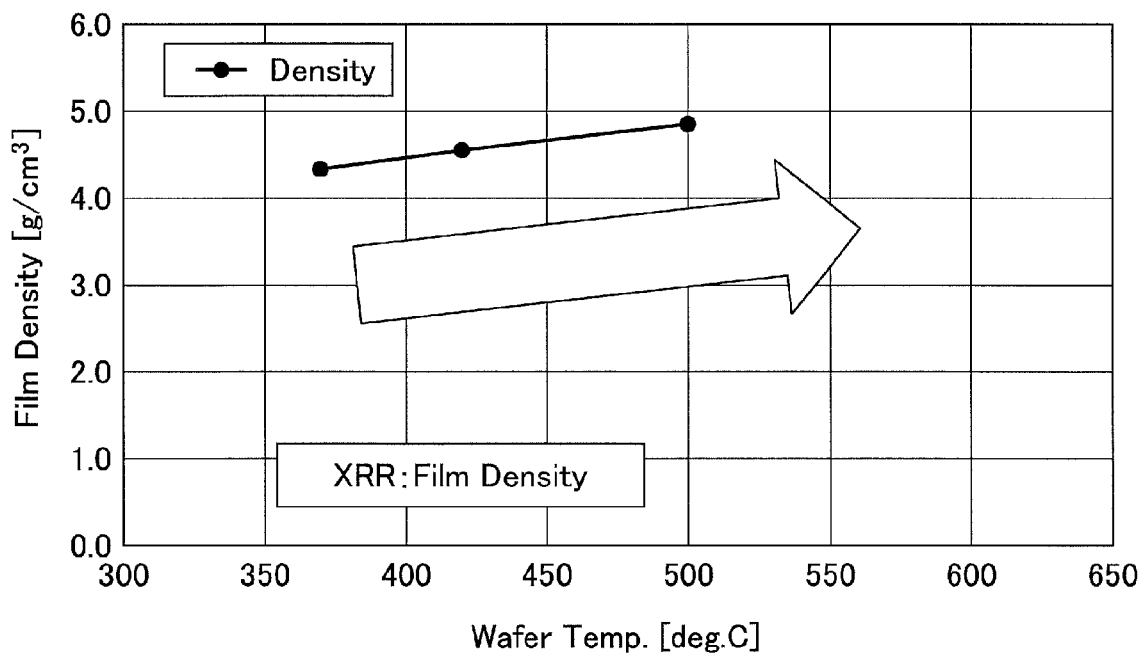
FIG. 9 illustrates a relationship between a wafer temperature in a process of depositing a film and a film density.

FIG. 9 illustrates a relationship between a wafer temperature in a process of depositing a film and a film density. Referring to FIG. 9, a result of measuring a relationship between the wafer temperature (° C.) and the film density (g/cm$^3$) by X-ray Reflectivity (XRR) is illustrated. FIG. 9 illustrates that the TiN film has a property that the film density increases more as the wafer temperature becomes higher.

Figure 10:
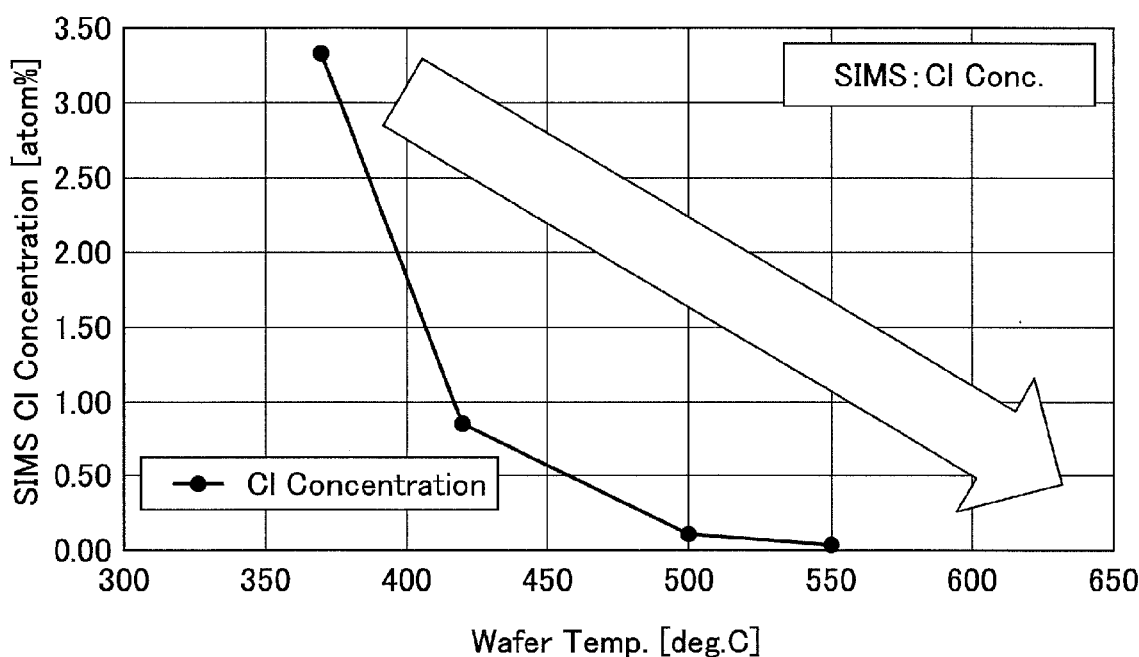
FIG. 10 illustrates a relationship between a wafer temperature in a process of depositing a film and a chloride concentration.

FIG. 10 illustrates a relationship between a wafer temperature in a process of depositing a film and a chloride concentration. Referring to FIG. 10, a result of measuring the relationship between the wafer temperature (° C.) in the process of depositing the film and the chloride concentration (atom %) using a Secondary Ion-Microscope Mass Spectrometer (SIMS) is illustrated. FIG. 10 illustrates that the chloride concentration becomes smaller as the wafer temperature is higher in the TiN film. Therefore, it is known that the purity of the TiN film is enhanced more so as to obtain a film having a higher purity (that is substantially equal to a higher density) as the wafer temperature is increased because if the purity of the TiN film is high Cl in a raw gas, which contains TiCl$_4$ and NH$_3$ for depositing the TiN film, is supposed not to remain much in the TiN film.

As illustrated in FIGS. 8 to 10, when the film deposition process is performed under the high temperature, the particle size of a TiN molecule in the TiN film becomes great, and the TiN film having the high density and the high purity is obtainable.

Figure 11A:
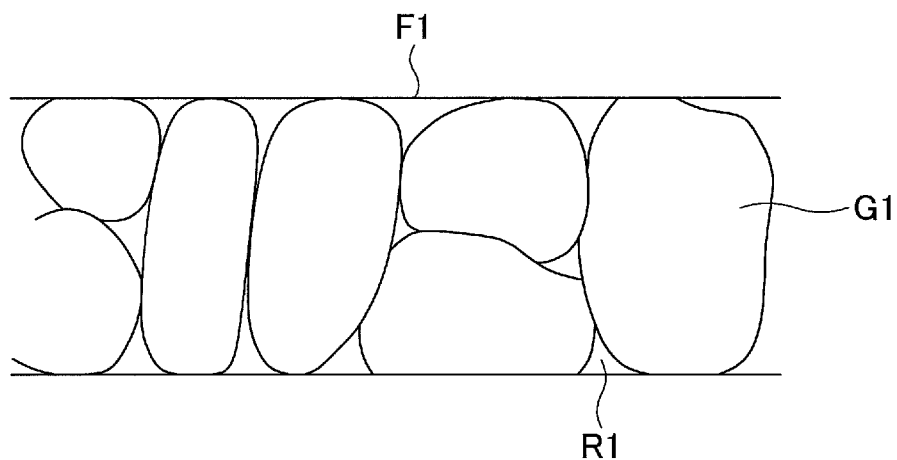
FIG. 11A illustrates an exemplary cross-sectional structure of a film having a great particle size obtained in a process of depositing the film under a high temperature condition in order to explain a principle of preventing metallic contamination using the film having the great particle size.
Figure 11B:
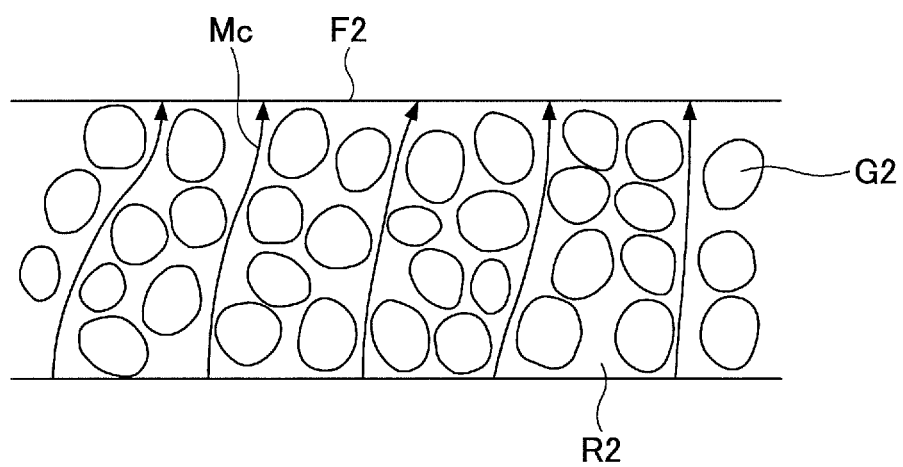
FIG. 11B illustrates an exemplary cross-sectional structure of a film having a small particle size.

FIGS. 11A and 11B illustrate the mechanism of preventing metallic contamination using the film, whose particle size is great and which is obtained in the film deposition process under the high temperature condition. FIG. 11A illustrates an example of a cross-sectional view of the film whose particle size is great. FIG. 11B illustrates an example of a cross-sectional view of the film whose particle size is small.

Referring to FIG. 11A, a molecular particle G1 existing inside a film F1 is illustrated. Because the particle size of the molecular particle G1 is great, a diffusion route R1 for a metal is choked by the molecular particle G1. Therefore, the diffusion route R1 is extremely narrow.

On the other hand, FIG. 11B illustrates a molecular particle G2 existing inside a film F2. Because the particle size of the molecular particle G2 is small, a diffusion route R2 is widened so that a contaminating metal Mc passes through the diffusion route R2.

As described, by increasing the particle size of the molecular particle G1, the diffusion route R1 is choked and the contaminating metal can be prevented from passing through the diffusion route R1. Further, a coating film for preventing the contaminating metal Mc from passing through can be provided on the inner surface of the chamber 1, the surface of the turntable 2, and surfaces of metallic components inside the chamber 1 by depositing a film whose particle size is great in the coating process so that a film is formed on the inner surface of the chamber 1, the surface of the turntable 2, and surfaces of metallic components inside the chamber 1. Under the state, the wafer W is introduced and the film is formed on the wafer W. Thus, due to the existence of the coating film, it is possible to prevent the contaminating metal Mc from separating out and suspending. Therefore, in the coating step, the temperature of the circular concave portion 24 is set to be higher than the wafer temperature in the processing step or at least the same as the wafer temperature in the processing step, and the coating film having the particle size with which the contaminating metal Mc from being diffused during the film deposition process. With this coating film, the metallic contamination can be prevented.

As described, according to the method of depositing the film of the embodiment, the coating film capable of preventing the metallic contamination is deposited before the film deposition process, and thereafter the film deposition process is performed. With this, it is possible to deposit the film with less metallic contamination.

Because the wafer W is not mounted on the turntable 2 in the coating step, the temperature of the circular concave portion 24, which is positioned close to the wafer W, is set as the standard instead of the temperature of the wafer W. However, a temperature sensor can be positioned at any place as long as the preset temperature in the coating step and the preset temperature in the processing step can be converted based on the wafer W.

First Embodiment

Figure 12:
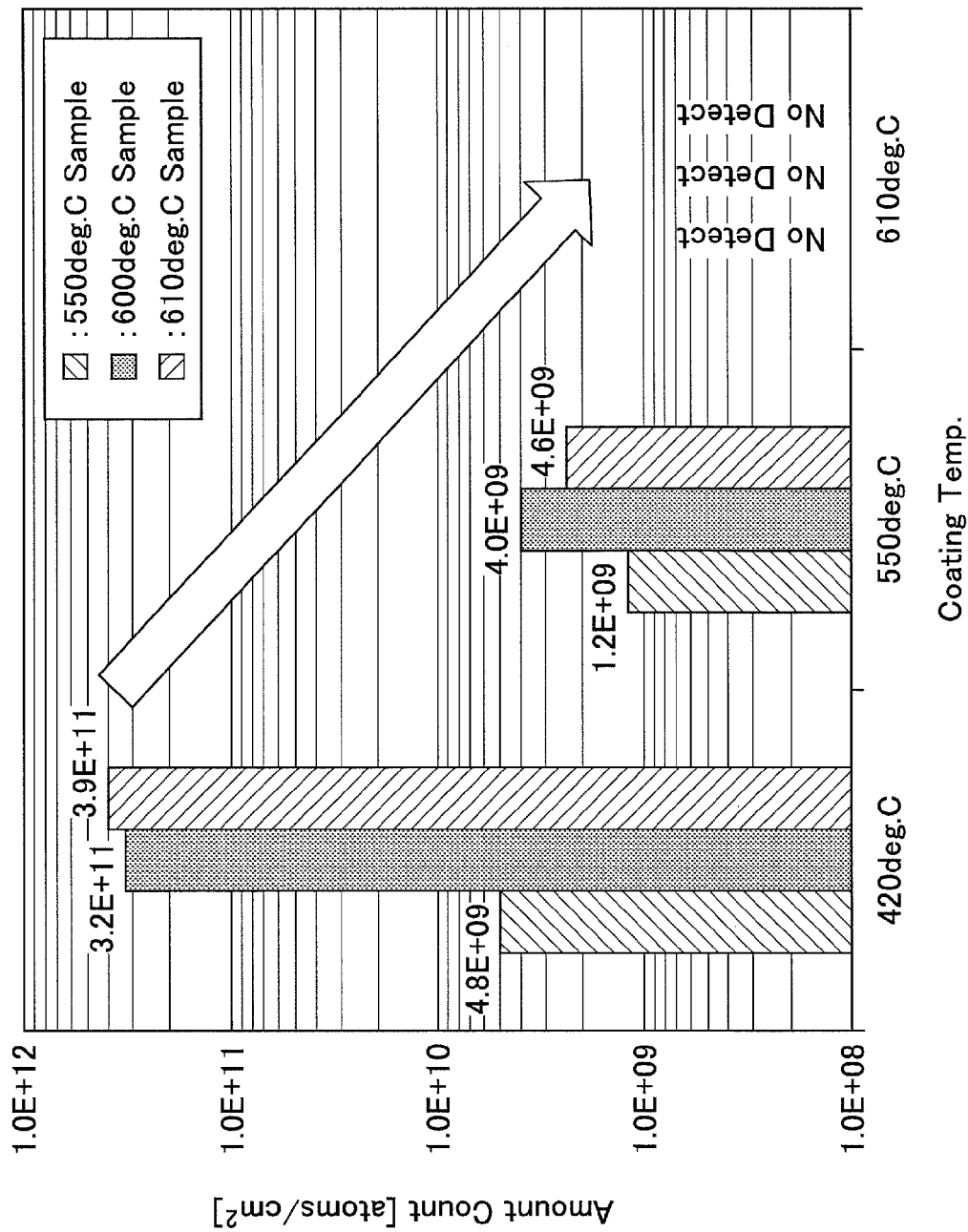
FIG. 12 illustrates a result of performing the method of depositing the film of a first embodiment.

FIG. 12 illustrates a result of performing the method of depositing the film of the first embodiment. Within the first embodiment, the film deposition apparatus of the above embodiment is used. Within the first embodiment, the preset temperature in the coating step and the preset temperature in the processing step are variously changed to deposit the TiN film. The amount of contamination by copper in the TiN film on the front surface side of the wafer is measured for variously changed preset temperatures.

Referring to FIG. 12, the abscissa axis represents the preset temperature (° C.) in the coating step, and the ordinate axis represents the amount of contamination by copper (atoms/cm$^2$). The parameter of the film deposition temperature is 420° C., 550° C., and 610° C. The parameter of the preset temperature in the processing step is 550° C., 600° C., and 610° C.

In a case where the preset temperature of the coating step is 420° C., the amount of contamination by copper was not reduced much under all the preset temperature in the processing step of 550° C., 600° C., and 610° C. However, because the preset temperatures in the processing step of 550° C. is relatively close to the preset temperatures in the coating step of 420° C., it was possible to reduce the amount of contamination by copper to a certain extent. Meanwhile, in cases where the preset temperatures in the processing step is 600° C. and 610° C., the amount of contamination by copper became great.

In a case where the preset temperature in the coating step is 550° C. and the preset temperature in the processing step is 550° C., which is equal to the preset temperature in the coating step, the amount of contamination by copper was substantially reduced. However, in a case where the preset temperature in the coating step is 600° C. and 610° C., which are higher than the preset temperature in the coating step, the amount of contamination by copper increased. Therefore, an excellent inhibiting effect was not obtained.

In a case where the preset temperature in the coating step is 610° C. and the preset temperature in the processing step is equal to or less than the preset temperature in the coating step. Therefore, in this case, copper contamination was not detected at all, and the amount of contamination by copper was zero.

As described, according to the method of depositing the film of the first embodiment, the preset temperature in the processing step is made equal to or less than the preset temperature in the coating step. With this, the amount of contamination by copper can be reduced.

Within the first embodiment, the reason why the amount of contamination by copper is selectively measured among various contaminating metals is that copper tends to diffuse and the diffusion of copper greatly affects inside an insulating film such as a TiN film or the like. Thus, the amount of contamination by copper is one of important features for a person who performs deposition of a film.

Second Embodiment

Figure 13:
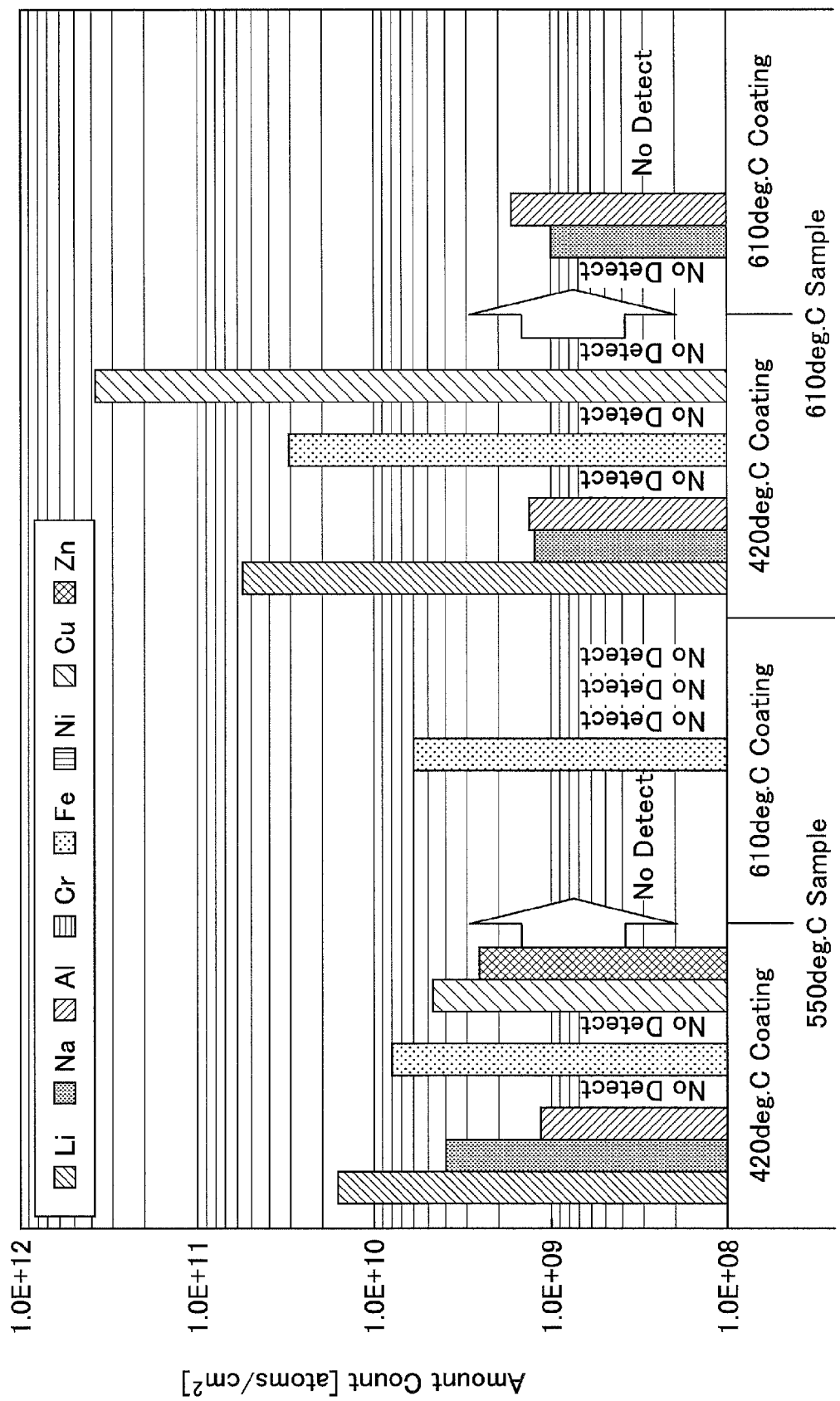
FIG. 13 illustrates a result of performing the method of depositing the film of a second embodiment.

FIG. 13 illustrates a result of performing the method of depositing the film of a second embodiment. Within the second embodiment, the film deposition apparatus of the above embodiment is used. Within the second embodiment, the preset temperature in the coating step and the preset temperature in the processing step are variously changed to deposit the TiN film. The amount of contamination by a metal other than copper in the TiN film on the front surface side of the wafer is measured for variously changed preset temperatures. Within the second embodiment, the parameter of the preset temperature in the coating step is 420° C. and 610° C., and the parameter of the preset temperature in the processing step is 550° C. (on the left side of FIG. 13) and 610° C. (on the right side of FIG. 13). Referring to FIG. 13, the abscissa axis represents the preset temperature (° C.) in the coating step and the processing step, and the ordinate axis represents the amount of contamination by metal (atoms/cm$^2$).

As illustrated on the left side of FIG. 13, in a case where the preset temperature in the processing step is 550° C. and the preset temperature in the coating step is 420° C., the amount of contamination by metal of Cr and Ni was not detected. However, the amount of contamination by metal of other elements, i.e., Li, Na, Al, Fe, Cu, and Zn was conspicuously detected. On the other hand, in a case where the preset temperature in the processing step is 550° C. and the preset temperature in the coating step is 610° C., the amount of contamination by a metal other than Cu was not detected. Therefore, in a case where the preset temperature in the coating step is 610° C. and the preset temperature in the processing step is 550° C., which is lower than the preset temperature of the coating step, the amount of contamination by metal can be reduced.

As illustrated on the right side of FIG. 13, in a case where the preset temperature in the processing step is 610° C. and the preset temperature in the coating step is 420° C., the amount of contamination by metal of Cr and Ni was not detected. However, the amount of contamination by metal of other elements, i.e., Li, Na, Al, Fe, Cu, and Zn was conspicuously detected. On the other hand, in a case where the preset temperature in the processing step is 610° C. and the preset temperature in the coating step is 610° C., the amount of contamination by a metal other than Na and Al was not detected. Therefore, in a case where the preset temperature in the coating step is 610° C. and the preset temperature in the processing step is 610° C., which is equal to the preset temperature of the coating step, the amount of contamination by metal can be reduced.

As described in the first and second embodiments, the method of depositing the film of the embodiment can cause the amount of contamination by metal of various metals including copper, which are contained in a TiN film, to be reduced.

Although an example that the method of depositing the film of the present invention is applied to the deposition of the TiN film is described in the method of depositing the film of the embodiment, the first embodiment, and the second embodiment, the content of forming the film on the surface of the wafer W by depositing the film whose particle size is large at the preset temperature in the coating step and depositing the film on the surface of the wafer W at the temperature equal to or less than the preset temperature in the coating step can be applied to a process of forming various films. Therefore, the method of depositing the film of the embodiment, the first embodiment, and the second embodiment can be applied to deposition of another film.

With the present invention, metallic contamination in a film occurring in forming the film can be inhibited.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A method of depositing a film using an atomic layer deposition (ALD) method while rotating a turntable provided inside a chamber and including a substrate mounting portion, onto which a substrate can be mounted, to cause the substrate to pass through first and second process areas, into which different gases to be mutually reacted are respectively supplied, the method of depositing the film comprising:

coating the turntable with the film under a state where the wafer is not mounted onto the turntable, the turntable is rotated, and the substrate mounting portion has a predetermined temperature; and processing to deposit the film on the wafer under a state where the wafer is mounted onto the turntable, the turntable is rotated, and the substrate has a temperature equal to or less than the predetermined temperature.

2. The method of depositing the film according to claim 1, wherein the predetermined temperature is equal to or more than 600° C.

3. The method of depositing the film according to claim 1, wherein the predetermined temperature is applied by a heater provided below the turntable.

4. The method of depositing the film according to claim 1, wherein the different gases to be mutually reacted include a titanium containing gas and a nitrogen containing gas, and wherein the titanium containing gas is supplied to the first process area, and the nitrogen containing gas is supplied to the second process area.

5. The method of depositing the film according to claim 4, further comprising:

supplying an inert gas inside a separating area provided between the first process area and the second process area and causing the substrate mounting portion to pass through the separating area.

6. The method of depositing the film according to claim 5, wherein the separating area is provided between the first process area and the second process area along a rotational direction of the turntable, and the inert gas is applied to the turntable from a space between the turntable and a lower ceiling surface positioned lower than ceiling surfaces of the first and second process areas facing the turntable.

7. The method of depositing the film according to claim 4, wherein the titanium containing gas is $TiCl_4$, and wherein the nitrogen containing gas is $NH_3$.

8. The method of depositing the film according to claim 1, wherein the chamber and the turntable contain a plurality of types of metals.

9. The method of depositing the film according to claim 8, wherein the plurality of types of metals includes at least copper.

* * * * *